US008928416B2

(12) United States Patent
Zhao (10) Patent No.: US 8,928,416 B2
(45) Date of Patent: Jan. 6, 2015

(54) TRANSCEIVER, VOLTAGE CONTROL OSCILLATOR THEREOF AND CONTROL METHOD THEREOF (75) Inventor: Haibing Zhao, Su Chou (CN)

(73) Assignee: Realtek Semiconductor Corp., Hsinchu (TW)

( * ) Notice: Subject to any disclaimer, the term of this patent is extended or adjusted under 35 U.S.C. 154(b) by 136 days.

(21) Appl. No.: 13/408,909

(22) Filed: Feb. 29, 2012

(65) Prior Publication Data

US 2012/0223750 A1 Sep. 6, 2012

(30) Foreign Application Priority Data

Mar. 1, 2011 (CN) .......................... 2011 1 0049707

(51) Int. Cl.
*H03L 7/00* (2006.01)
*H03L 7/07* (2006.01)
*H03L 7/08* (2006.01)
*H03L 7/099* (2006.01)

(52) U.S. Cl.
CPC ................ *H03L 7/07* (2013.01); *H03L 7/0805* (2013.01); *H03L 7/0807* (2013.01); *H03L 7/0995* (2013.01)
USPC .................... 331/2; 331/1 R; 331/10; 331/16; 331/17; 331/25; 331/34; 331/46; 331/47; 331/48; 331/55; 331/57; 327/147; 327/156; 327/162; 375/376

(58) Field of Classification Search
CPC ....... H03L 7/00; H03L 7/0805; H03L 7/0807; H03L 7/0995
USPC .......... 327/147, 156, 162; 331/1 R, 2, 10, 16, 331/17, 25, 34, 57, 46–48, 55, 56; 375/376; 455/75, 86, 139, 169.1, 180.3
See application file for complete search history.

(56) References Cited

U.S. PATENT DOCUMENTS

| 5,072,195 | A | * | 12/1991 | Graham et al. | 331/2 |
|---|---|---|---|---|---|
| 5,075,639 | A | * | 12/1991 | Taya | 331/2 |
| 5,302,919 | A | * | 4/1994 | Abe | 331/2 |
| 5,646,562 | A | * | 7/1997 | Abe | 327/156 |
| 5,657,359 | A | * | 8/1997 | Sakae et al. | 375/376 |
| 5,734,301 | A | * | 3/1998 | Lee et al. | 331/2 |
| 5,909,474 | A | * | 6/1999 | Yoshizawa | 375/376 |
| 6,859,079 | B2 | * | 2/2005 | Haraguchi et al. | 327/156 |

* cited by examiner

*Primary Examiner* — Arnold Kinkead
*Assistant Examiner* — Richard Tan
(74) *Attorney, Agent, or Firm* — Muncy, Geissler, Olds & Lowe, P.C.

(57) ABSTRACT

A transceiver includes a phase lock loop (PLL) and a clock data recovery circuit (CDR). The phase lock loop generates a first level control signal. The clock data recovery circuit, coupled to the phase lock loop, locks an incoming data signal to generate a data recovery clock according to a second level control signal. Wherein the clock data recovery circuit receives the first level control signal to further control a frequency range of the data recovery clock.

5 Claims, 7 Drawing Sheets

TRANSCEIVER, VOLTAGE CONTROL OSCILLATOR THEREOF AND CONTROL METHOD THEREOF

BACKGROUND OF THE INVENTION (a) Field of the Invention

The invention relates to a device, particularly to a voltage control oscillator and control method thereof.

(b) Description of the Related Art

Applications, like PCIE (Peripheral Component Interconnection EXPRESS), universal serial bus (such as USB 3.0), etc., may use a transceiver to receive or transmit data. The transceiver usually comprises various circuit modules, such as a phase lock loop (PLL), a clock data recovery (CDR) circuit, etc.

Further a clock data recovery (CDR) circuit usually includes a voltage control oscillator (VCO). In the system design, the voltage control oscillator needs to have a broader frequency range and a smaller KVCO so that the clock data recovery circuit can lock frequency in a broader frequency range and output a signal with lowered jitter. However, the designed smaller KVCO may result in difficulty of covering larger temperature or voltage variation after the clock data recovery circuit locks frequency so as to cause the application limitation.

BRIEF SUMMARY OF THE INVENTION

One object of the invention is to provide a voltage control oscillator to cover a broader frequency range.

One object of the invention is to provide a voltage control oscillator to cover a larger processing, temperature or voltage variation range.

One object of the invention is to provide a structure of a voltage control oscillator to have a smaller VCO gain (KVCO).

An embodiment of the invention provides a transceiver, including a phase lock loop and a clock data recovery circuit. The phase lock loop generates a first level control signal. The clock data recovery circuit, coupled to the phase lock loop, locks an incoming data signal according to a second level control signal to generate a data recovery clock. Wherein the clock data recovery circuit receives the first level control signal to further control a frequency range of the data recovery clock.

Furthermore, an embodiment of the invention provides a voltage control oscillation device, including a first voltage control oscillator, for generating a first level control signal and generating a first oscillation frequency; and a second voltage control oscillator, coupled to the first voltage control oscillator. The second voltage control oscillator comprises a delay cell, for generating a second oscillation frequency; a signal supply unit, for adjusting the second oscillation frequency according to the first level control signal; and a signal control unit, for controlling a received data signal locked by the second oscillation frequency according to a second level control signal.

An embodiment of the invention provides a control method for a voltage control oscillation device, including: providing a first voltage control oscillator disposed in a phase lock loop and a second voltage control oscillator disposed in a clock data recovery circuit; setting a control voltage of the clock data recovery circuit to be equal to a reference voltage wherein the reference voltage is related to an oscillation frequency of the first voltage control oscillator; enabling the phase lock loop to generate a level control signal; generating a data recovery clock according to the level control signal by the second voltage control oscillator; and enabling the clock data recovery circuit.

An embodiment of the invention provides a voltage control oscillation device, comprising: a voltage control oscillator, disposed in a clock data recovery circuit of a transceiver and having a small voltage control oscillator (VCO) gain wherein a frequency of the voltage control oscillator is adjusted by a level control signal having a broad frequency range; wherein the level control signal is from a phase lock loop in the transceiver.

The framework of various voltage control oscillators according to embodiments let the first voltage control oscillator in the phase lock loop and the second voltage control oscillator in the clock data recovery circuit be coupled together to have the second voltage control oscillator satisfy a larger frequency range and have a smaller VCO gain.

Other objects and advantages of the invention can be better understood from the technical characteristics disclosed by the invention. In order to clarify the above mentioned and other objects and advantages of the invention, examples accompanying with figures are provided and described in details in the following.

DETAILED DESCRIPTION OF THE INVENTION

Figure 1A:
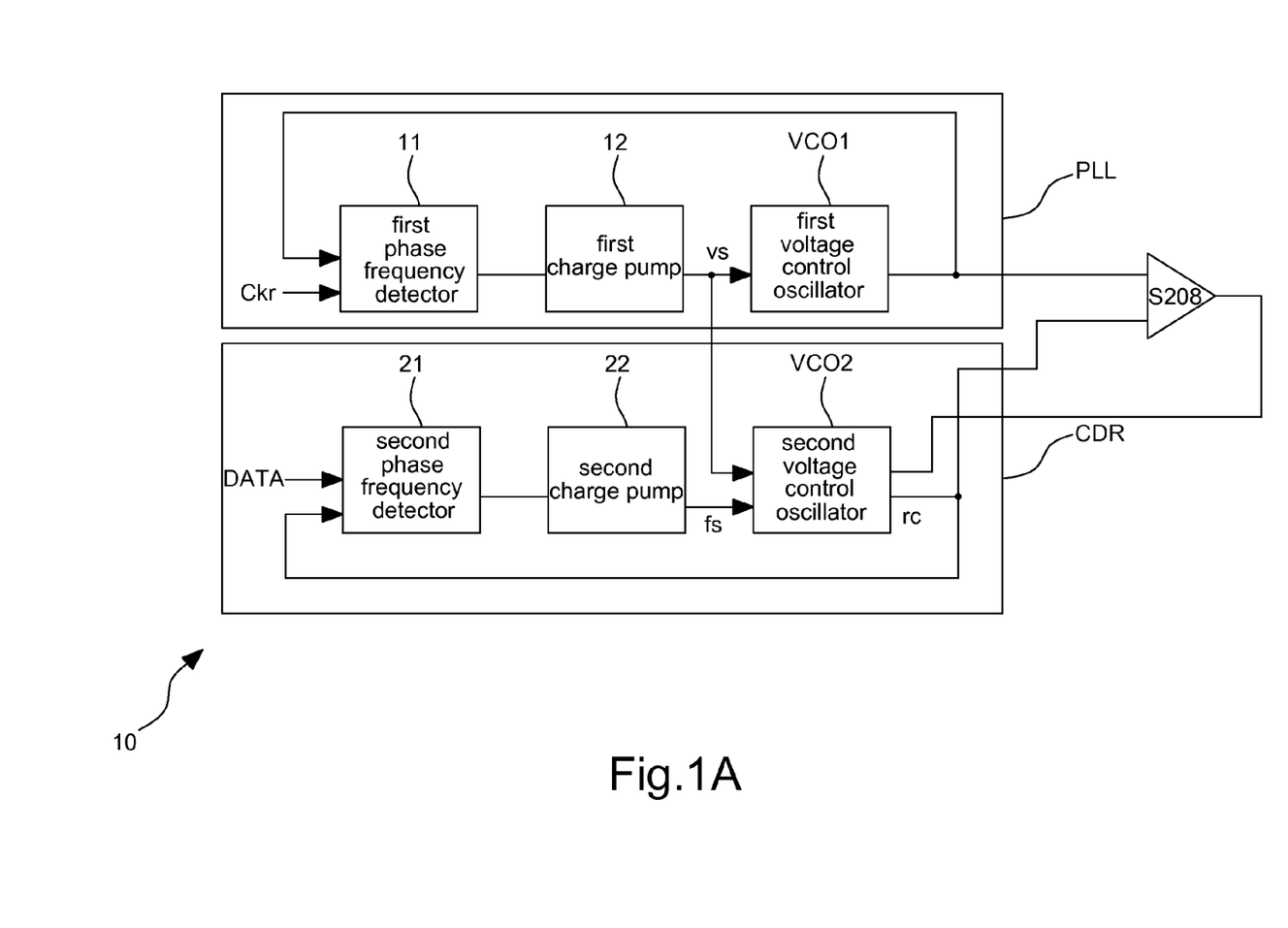
FIG. 1A shows a schematic diagram illustrating a transceiver according to one embodiment of the invention.

FIG. 1A shows a schematic diagram illustrating a transceiver according to an embodiment of the invention. The transceiver 10 includes a phase lock loop PLL and a clock data recovery circuit CDR.

The phase lock loop PLL includes a first phase frequency detector 11, a first charge pump 12 and a first voltage control oscillator VCO1. In an embodiment, a clock Ckr as shown in FIG. 1A is generated by a stable clock generator.

The clock data recovery circuit CDR couples to the phase lock loop PLL. The clock data recovery circuit CDR includes a second phase frequency detector 21, a second charge pump 22 and a second voltage control oscillator VCO2. In an embodiment, the phase lock loop PLL and the clock data recovery circuit CDR may further include a loop filter to filter noises of signals.

The clock data recovery circuit CDR of an embodiment locks a received data signal DATA according to a second level control signal fs generated by the second charge pump 22 so as to generate a data recovery clock rc. The first charge pump 12 of the phase lock loop PLL generates a first level control signal vs. Further the first charge pump 12 outputs the first level control signal vs to the second voltage control oscillator VCO2 to control the frequency range of the data recovery clock rc of the clock data recovery circuit CDR.

In an embodiment, the first level control signal vs may be a voltage control current or voltage, and the second level control signal fs may a voltage control current or voltage. In another embodiment, the first level control signal vs may be used for coarse adjustment of the oscillation frequency of the second voltage control oscillator VCO2, and the level second level control signal fs may be used for fine adjustment of the oscillation frequency of the second voltage control oscillator VCO2. Please note that the frequency range of the first level control signal vs may be larger than that of the second level control signal fs.

Figure 1B:
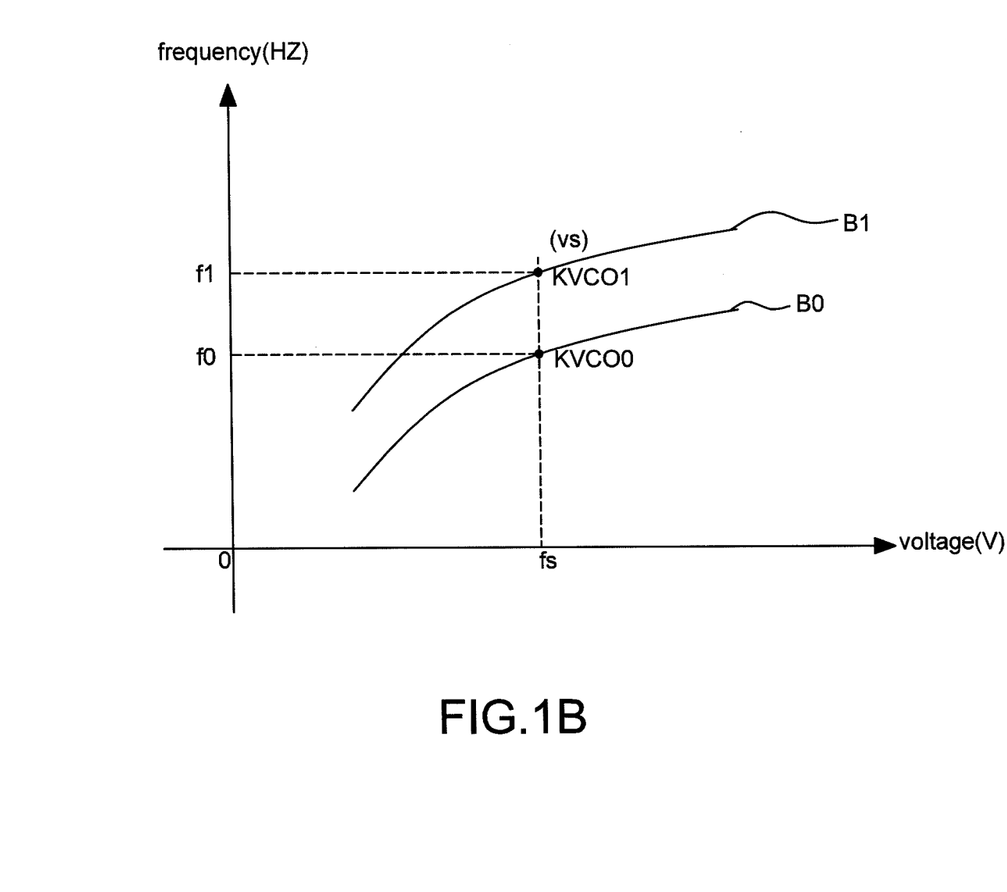
FIG. 1B shows a waveform diagram of the transceiver shown in FIG. 1A.

The clock data recovery circuit CDR controls the second voltage control oscillator VCO2 according to the first level control signal vs to adjust the frequency of the output data recovery clock rc. The clock data recovery circuit CDR further controls the second voltage control oscillator VCO2 according to the second level control signal fs to lock the clock of the data signal DATA. Please referring to FIG. 1B, if the clock data recovery circuit CDR only receives the second level control signal fs without receiving the first level control signal vs, the curve B0 of the KVCO0 is generated but the curve B0 may not lock to the frequency f1. Thus, a broader frequency range and a smaller KVCO cannot be achieved at the same time. In the embodiment of the present invention, the clock data recovery circuit CDR receives both of the second level control signal fs and the first level control signal vs. The first level control signal vs from the phase lock loop PLL assists the second voltage control oscillator VCO2 to further adjust the KVCO of the second voltage control oscillator VCO2 from KVCO0 to KVCO1 to generate the curve B1. Thus, the curve B1 can be adjusted to lock to the frequency f1. In this embodiment, the first level control signal vs regulates the frequency of the data recovery clock rc of the second voltage control oscillator VCO2 to reach f1. The frequency of the data recovery clock rc of the second voltage control oscillator VCO2 can be adjusted, according to the second level control signal fs, based on f1 to lock to the phase of the data signal DATA so as to achieve a function of correct clock recovery.

Since the phase lock loop PLL operates based on a stable clock Ckr, the phase lock loop PLL can be designed to operate within a broader frequency range. In order to lock the frequency of the data signal, the clock data recovery circuit CDR is designed to have a smaller VCO gain (KVCO). Therefore, an embodiment of the transceiver 10 sets the clock data recovery circuit CDR couples to the phase lock loop PLL. The transceiver 10 uses the first level control signal vs generated by the phase lock loop PLL to adjust the oscillation frequency of the second voltage control oscillator VCO2 so as to accomplish effect of operation within a broader frequency range. Further if the environmental state (such as temperature degree and voltage drop) varies, the transceiver 10 can use the first level control signal vs to adjust the oscillation frequency of the clock data recovery circuit CDR accordingly so that the frequency of the data signal DATA can be locked under the condition that the environmental state varies.

On the basis of the above, because the clock data recovery circuit of this embodiment uses the first level control signal, from the phase lock loop or an external circuit, accompanying with its second level control signal to control the second voltage control oscillator of the clock data recovery circuit, the clock data recovery circuit can generate a small KVCO and operate within a broad frequency range. Thus the problem in the prior art that the frequency range of the clock data recovery circuit cannot cover the variation of temperature, voltage, etc. can be solved.

It should be noted that in the prior art the voltage control oscillator module of the clock data recovery circuit is designed to include a circuit module to generate a voltage-controlled current in addition to a fixed-biasing current in order to satisfy system requirements. The fixed-biasing current and the voltage-controlled current are both used to let the voltage control oscillator satisfy a demand of including a larger frequency range and a smaller KVCO. However, the disadvantage of the structure in the prior art is that, after the clock data recovery circuit locks the clock of the data signal, the frequency variation range of the voltage control oscillator is very small and cannot cover the larger variation of temperature and voltage. Thus, the operation condition can only be satisfied by increasing KVCO of the voltage control oscillator. As a result, the circuit functionality is sacrificed or the area of circuits is increased so that the effect of the invention cannot be achieved by the prior clock data recovery circuit.

Furthermore, in the prior art, generally the phase lock loop and the clock data recovery circuit are not connected or coupled and thus the effect of the invention cannot be achieved.

Figure 2A:
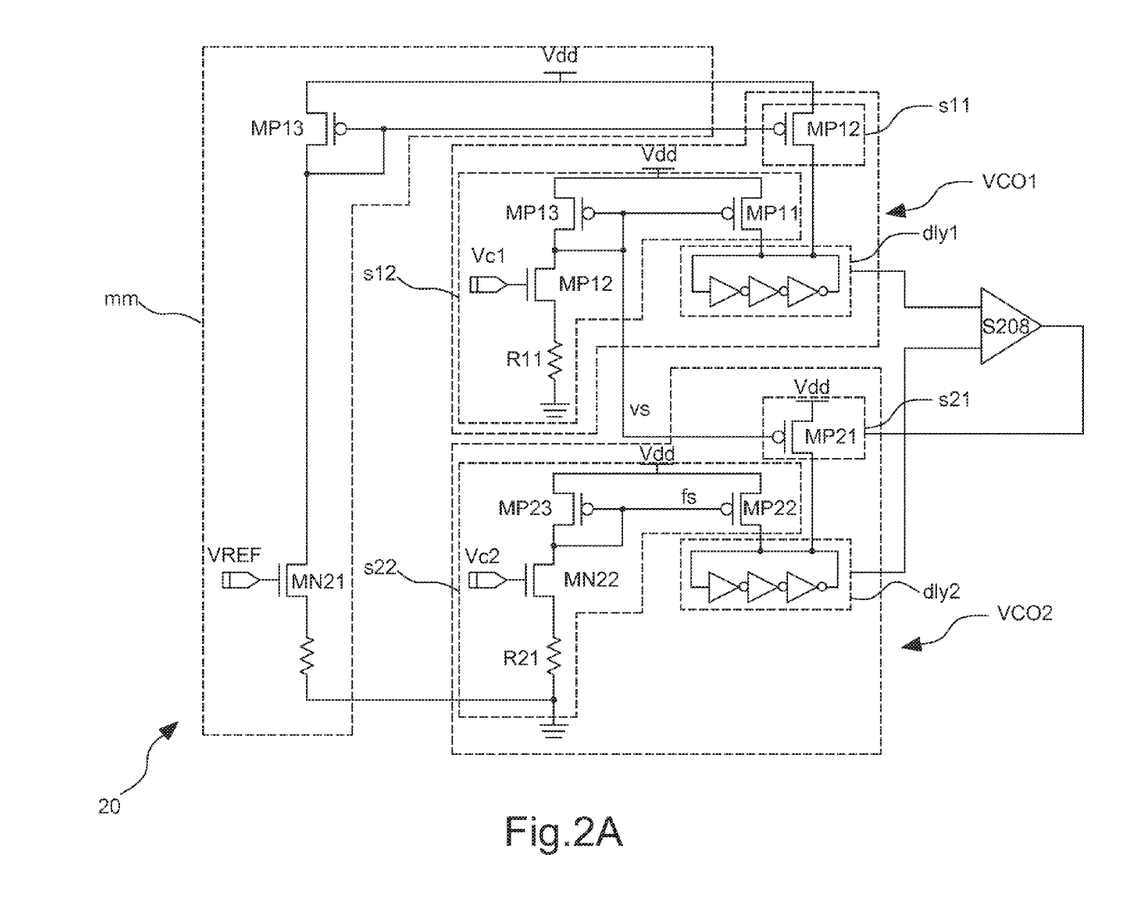
FIG. 2A shows a schematic diagram illustrating a voltage control oscillation device according to one embodiment of the invention.
Figure 2B:
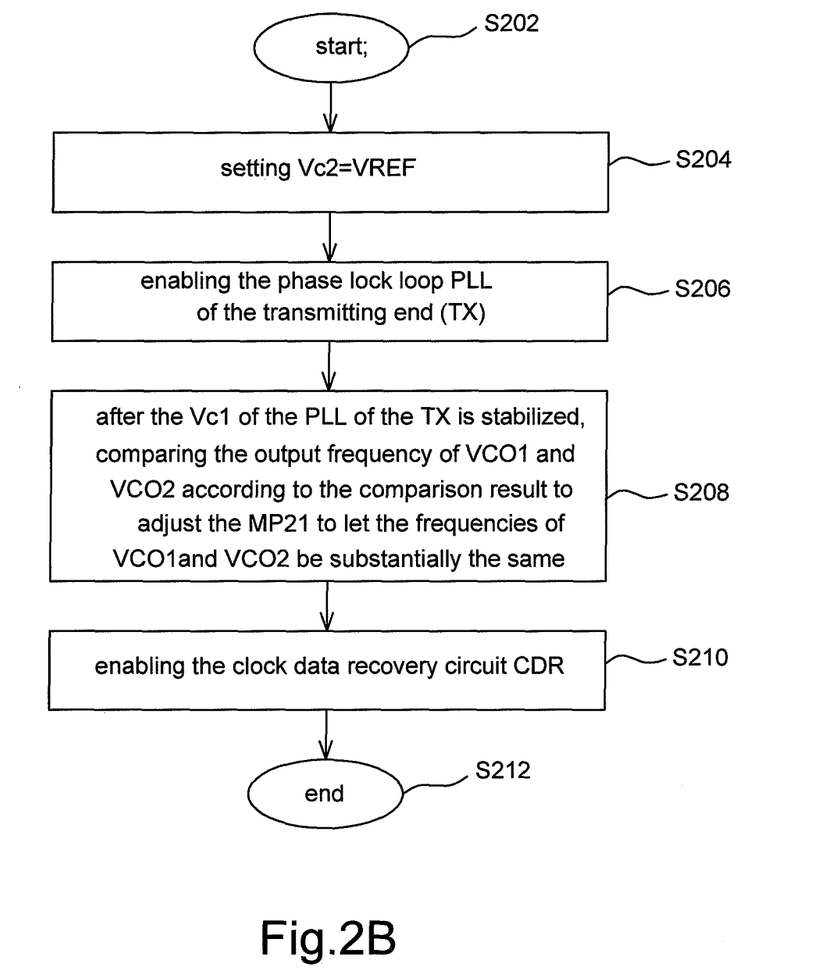
FIG. 2B show a flow chart of the control method of the voltage control oscillation device shown in FIG. 2A.

FIG. 2A shows a schematic diagram illustrating a voltage control oscillation device 20 according to one embodiment of the invention. FIG. 2B show a flow chart of the control method of the voltage control oscillation device 20 shown in FIG. 2A. The voltage control oscillation device 20 includes a first voltage control oscillator VCO1 disposed in the phase lock loop PLL and a second voltage control oscillator VCO2 disposed in the clock data recovery circuit CDR. The first voltage control oscillator VCO1 has relation to the second voltage control oscillator VCO2. For example, a power source module (mm) may be used to couple the first voltage control oscillator VCO1 and the second voltage control oscillator VCO2 as a reference power source of both.

The first voltage control oscillator VCO1 includes a first signal supply unit s11, a first signal control unit s12 and a first delay cell dly1. The second voltage control oscillator VCO2 includes a second signal supply unit s21, a second signal control unit s22 and a second delay cell dly2.

The first signal supply unit s11 of the first voltage control oscillator VCO1 has one terminal coupled to the power source module mm and the other terminal coupled to the first delay cell dly1. In an embodiment, the first signal supply unit s11 may be a transistor MP12. The first signal control unit s12 has one terminal coupled to the first delay cell dly1 and the other terminal coupled to the second signal supply unit s21 of the second voltage control oscillator VCO2. The first delay cell dly1 may be used to generate an oscillation frequency.

The second signal supply unit s21 of the second voltage control oscillator VCO2 has one terminal coupled to the first signal control unit s12 of the first voltage control oscillator VCO1 and the other terminal coupled to the second delay cell dly2. In an embodiment, the second signal supply unit s21 may be a transistor MP21. The second signal control unit s22 has one terminal coupled to the second delay cell dly2 and the other terminal coupled to the power source module mm. The second delay cell dly2 may be used to generate an oscillation frequency. An ordinary skill in the art should be able to understand the coupling relationship of elements and replacing each element by other elements. For example, a resistor can be replaced by a transistor or a MOS, and PMOS or NMOS transistor is interchangeable.

In one embodiment, voltage control oscillation device 20 sets a control voltage Vc2 of the second signal control unit s22 of the second voltage control oscillator VCO2 to be equal to a reference voltage related to the phase lock loop PLL. For example, the reference voltage related to the phase lock loop PLL may be the reference voltage VREF of the power source module mm shown in FIG. 2B. Then the phase lock loop PLL is enabled to generate the first level control signal vs. The second signal supply unit s21 of the second voltage control oscillator VCO2 controls the oscillation frequency of the delay cell dly2 according to the first level control signal vs. Further the clock data recovery circuit CDR is enabled to generate the data recovery clock rc. Thus, the first level control signal vs of the first voltage control oscillator VCO1 in the phase lock loop PLL is used to control the frequency range of the second voltage control oscillator VCO2 so that the clock data recovery circuit CDR can generate a smaller KVCO and also operate within a broader frequency range at the same time.

On the other hand, the above embodiment can be controlled more precisely and the details of the control method are shown in the flow chart of FIG. 2B.

Step S202: start;

Step S204: setting the control voltage Vc2 of the second voltage control oscillator VCO2 to the reference voltage VREF of the power source module mm;

Step S206: enabling the phase lock loop PLL of the transmitting (TX) end;

Step S208: generating a phase lock frequency signal 1c according to the first level control signal vs by the first voltage control oscillator VCO1 and generating the data recovery clock rc according to the first level control signal vs by the second voltage control oscillator VCO2, after the first level control signal vs of the phase lock loop PLL is stabilized; comparing the frequencies of the phase lock frequency signal 1c and the data recovery clock rc and adjusting the frequencies of the phase lock frequency signal 1c and the data recovery clock rc to be substantially the same according to the comparison result; In an embodiment, the second signal supply unit s21 (such as transistor MP21) is adjusted according to the comparison result to let the frequencies of the phase lock frequency signal 1c and the data recovery clock rc be substantially the same.

Step S210: enabling the clock data recovery circuit CDR; and

Step S212: end.

The design of the above method can make the frequency variation of the second voltage control oscillator VCO2 caused by the temperature and voltage varying be controlled by the first level control signal vs supplied by the first voltage control oscillator VCO1 of the phase lock loop PLL. Thus the second voltage control oscillator VCO2 can satisfy a smaller KVCO demand and can more precisely cover the frequency variation caused by the temperature and voltage varying.

Figure 3A:
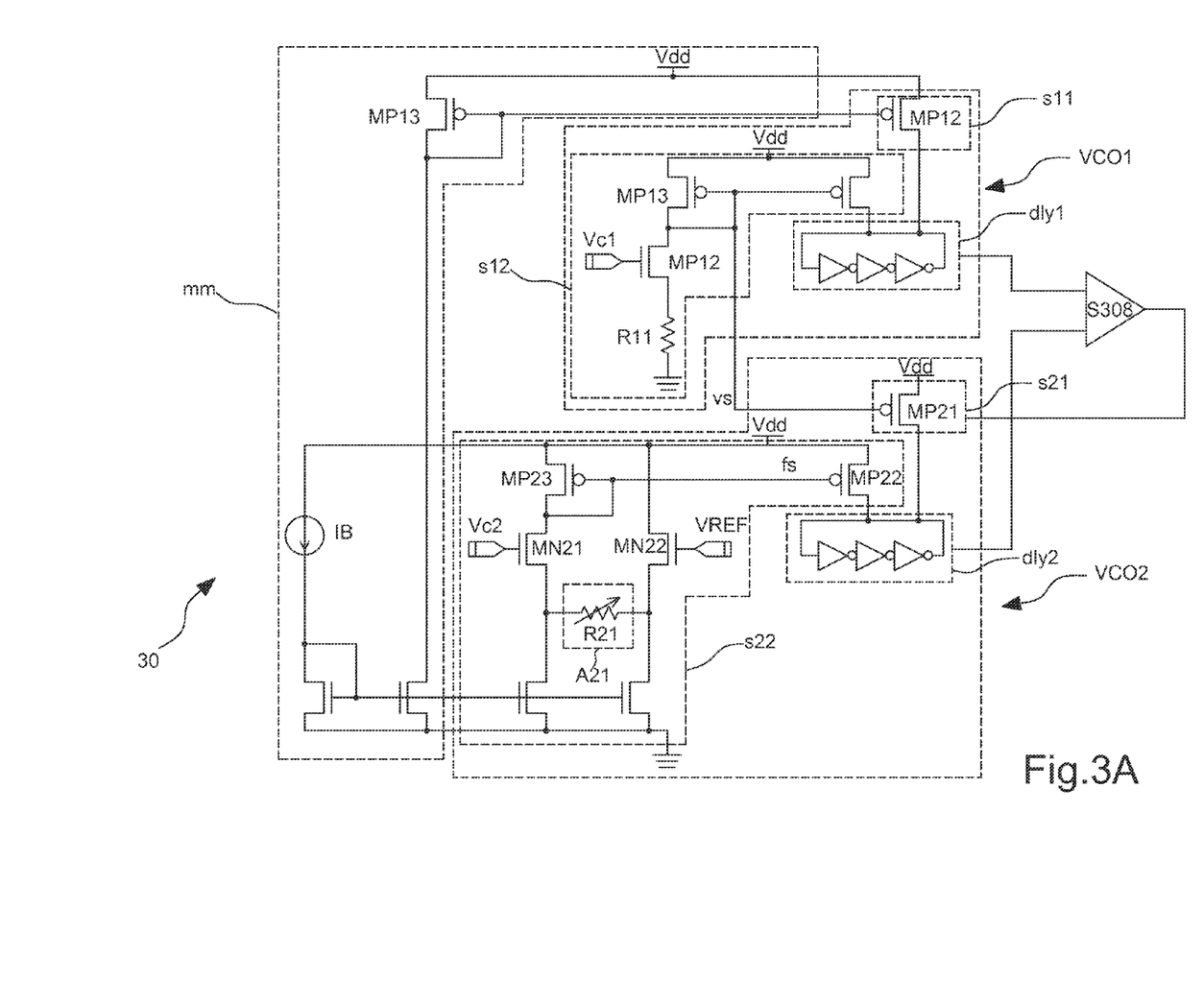
FIG. 3A shows a schematic diagram illustrating a voltage control oscillation device according to one embodiment of the invention.
Figure 3B:
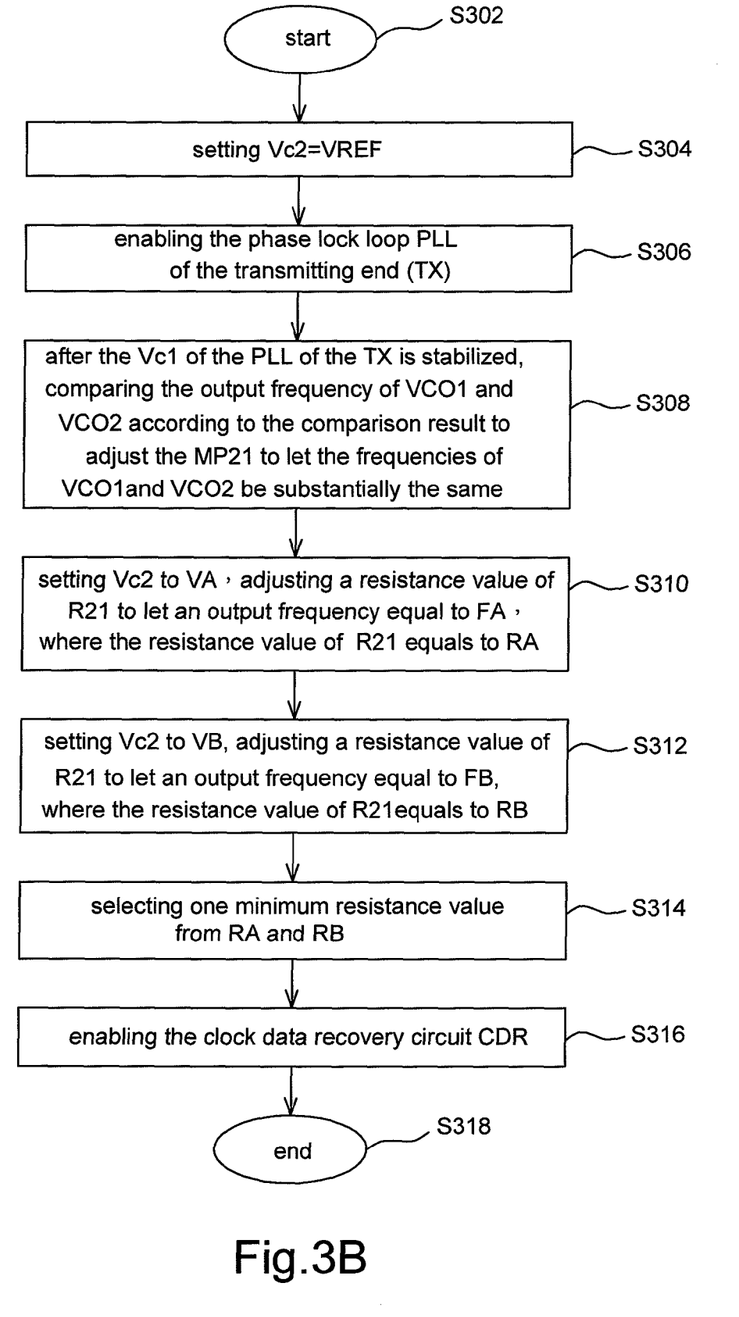
FIG. 3B shows a flow chart of the control method of the voltage control oscillation device shown in FIG. 3A.

FIG. 3A shows a schematic diagram illustrating a voltage control oscillation device 30 according to an embodiment of the invention. FIG. 3B shows a flow chart of the control method of the voltage control oscillation device 30 shown in FIG. 3A. The voltage control oscillation device 30 includes a first voltage control oscillator VCO1 disposed in the phase lock loop PLL and a second voltage control oscillator VCO2 disposed in the clock data recovery circuit CDR. The first voltage control oscillator VCO1 has relation to the second voltage control oscillator VCO2. For example, a power source module (mm) may be used to couple the first voltage control oscillator VCO1 and the second voltage control oscillator VCO2 as a reference power source of both.

The first voltage control oscillator VCO1 includes a first signal supply unit s11, a first signal control unit s12 and a first delay cell dly1. The second voltage control oscillator VCO2 includes a second signal supply unit s21, a second signal control unit s22 and a second delay cell dly2. An ordinary skill in the art should is able to understand the coupling relationship of elements and replacing each element by other elements. For example, a resistor can be replaced by a transistor or MOS and PMOS or NMOS transistor is interchangeable.

The configuration and operation method of the voltage control oscillation device 30 shown in FIG. 3A are similar to those of the voltage control oscillation device 20 shown in FIG. 2A. The difference is that the second signal control unit s22 of the voltage control oscillation device 30 further includes a regulation unit A21. In an embodiment, the regulation unit A21 may be a variable resistor R21. The regulation unit A21 may be used to adjust the current or voltage to be inputted into the second delay cell dly2 to more precisely control KVOC of the second voltage control oscillator VCO2.

Figure 3C:
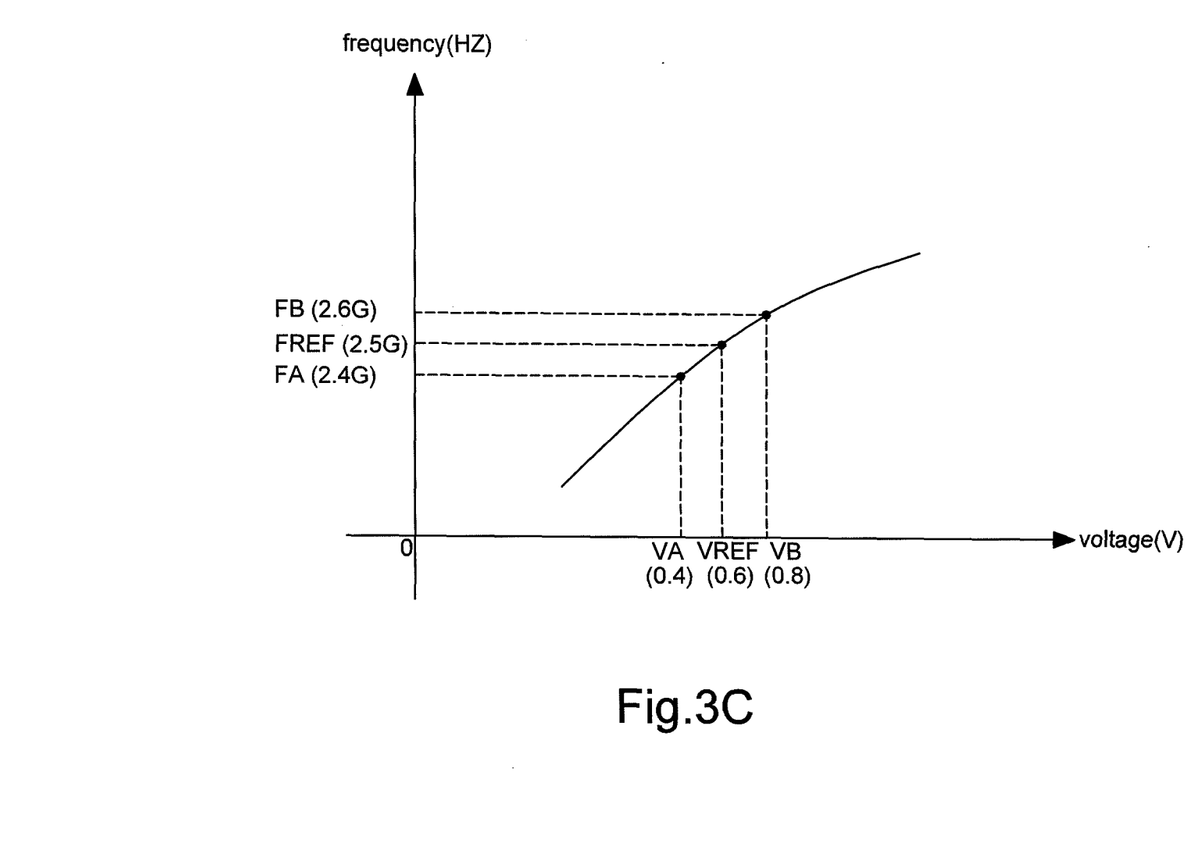
FIG. 3C shows a waveform diagram of the voltage control oscillation device shown in FIG. 3A.

Please refer to FIGS. 3A, 3B and 3C. The flow of the control method for the voltage control oscillation device 30 according to an embodiment of the invention is described in details.

Step S302: start;

Step S304: setting the control voltage Vc2 of the second voltage control oscillator VCO2 to the reference voltage VREF of the power source module mm; (VREF=0.6V and FREF=2.5 GHz in FIG. 3C)

Step S306: enabling the phase lock loop PLL of the transmitting end (TX);

Step S308: generating a phase lock frequency signal 1c according to the first level control signal vs by the first voltage control oscillator VCO1 and generating the data recovery clock rc according to the first level control signal vs by the second voltage control oscillator VCO2, after the first level control signal vs of the phase lock loop PLL is stabilized; comparing the frequencies of the phase lock frequency signal 1c and the data recovery clock rc and adjusting the frequencies of the phase lock frequency signal 1c and the data recovery clock rc to be substantially the same according to the comparison result; In an embodiment, the second signal supply unit s21 (such as transistor MP21) is adjusted according to the comparison result to let the frequencies of the phase lock frequency signal 1c and the data recovery clock rc be substantially the same.

Step S310: setting the control voltage Vc2 of the second voltage control oscillator VCO2 to be equal to a first preset voltage VA and adjusting a resistance value of a variable resistor R21 to let an output frequency by the second voltage control oscillator VCO2 equal to frequency FA where the resistance value of the variable resistor R21 equals to RA at the time; (for example, VA=0.4V and FA=2.4 GHz in FIG. 3C)

Step S312: setting the control voltage Vc2 of the second voltage control oscillator VCO2 to be equal to a second preset voltage VB and adjusting a resistance value of a variable resistor R21 to let an output frequency by the second voltage control oscillator VCO2 equal to FB where the resistance value of the variable resistor R21 equals to RB at the time; (for example, VA=0.8V and FA=2.6 GHz in FIG. 3C)

Step S314: selecting one minimum resistance value of RA and RB where KVCO of the second voltage control oscillator VCO2, that is, KVCO=(FA−FB)/VA−VB);

Step S316: enabling the clock data recovery circuit CDR; and

Step S318: end.

The above method not only has the advantages of the circuit shown in FIG. 2A but also can more precisely control KVCO of the second voltage control oscillator VCO2 to generate KVCO=(FA−FB)/VA−VB). Please note that adjustment of the regulation unit A21 can adjust current of a first current path (a path including the transistor MN21) and a second current path (a path including the transistor MN22) to further adjust a driving voltage or conducting current (such as the second level control signal fs) of the transistor MP22 and change the frequency of the delay cell dly2. The selection of the minimum resistance value from RA and RB can maximize the frequency range covered by KVCO. When there is variation during processing, KVCO of the second voltage control oscillator VCO2 will not be varied with the process.

It should be noted that, in an embodiment, one step of S308: adjusting the second signal supply unit s21 is optional and can be omitted. In another embodiment, one step of S310, S312 and S314: selecting the value of R21 is also optional and can be all omitted or only one of step S310 and S312 is selected.

The framework of various voltage control oscillators according to embodiments make the first voltage control oscillator in the phase lock loop PLL and the second voltage control oscillator in the clock data recovery circuit CDR be coupled to let the second voltage control oscillator satisfy a larger frequency range and a smaller KVCO. PLL/CDR can cover a very large temperature or voltage variation during operation and the existed control signal of a broad frequency range is used to adjust the frequency of the clock data recovery circuit CDR having a small KVCO. Thus, extra circuit is not needed to generate additional control signal so that the area of circuits can be reduced and the production cost can be decreased. Therefore, the invention has great advantages.

Although the present invention has been fully described by the above embodiments, the embodiments should not constitute the limitation of the scope of the invention. Various modifications or changes can be made by those who are skilled in the art without deviating from the spirit of the invention. Any embodiment or claim of the present invention does not need to reach all the disclosed objects, advantages, and uniqueness of the invention. Besides, the abstract and the title are only used for assisting the search of the patent documentation and should not be construed as any limitation on the implementation range of the invention.

What is claimed is:

1. A transceiver, comprising:
    a phase lock loop, comprising a first voltage controlled oscillator gain (KVCO), wherein the phase lock loop generates a first level control signal at a locked state according to a reference voltage; and
    a clock data recovery circuit, comprising a second KVCO, wherein the clock data recovery circuit is coupled to the phase lock loop, generates a second level control signal according to the second KVCO and a control voltage which is equal to the reference voltage, and locks an incoming data signal according to the first level control signal and the second level control signal to generate a data recovery clock;
    a comparator, wherein the comparator is coupled to the phase lock loop and the clock data recovery circuit;
    wherein a frequency range of the data recovery clock is determined by the first level control signal and the second level control signal, and
    wherein the phase lock loop comprises a first voltage control oscillator; the clock data recovery circuit comprises a second voltage control oscillator; the first voltage control oscillator generates a phase lock frequency signal according to the first level control signal; the second voltage control oscillator generates the data recover clock; and the comparator compares the frequency of the phase lock frequency signal with the frequency of the data recovery clock to generate a comparison result and the second voltage control oscillator adjusts the frequency of the phase lock frequency signal to be substantially equal to the frequency of the data recovery clock according to the comparison result and then the transceiver enables the clock data recovery circuit.

2. The transceiver according to claim 1, wherein the first level control signal is a voltage control current or voltage, and the second level control signal is a voltage control current or voltage.

3. The transceiver according to claim 1, wherein if the frequency of the clock data recovery circuit is affected by temperature or voltage, the clock data recovery circuit adjusts the frequency according to the first level control signal.

4. A control method for a voltage control oscillation device, comprising:
    providing a first voltage control oscillator disposed in a phase lock loop and a second voltage control oscillator disposed in a clock data recovery circuit; wherein the phase lock loop comprising a first voltage controlled oscillator gain (KVCO) and generating a first level control signal at a locked state according to a reference voltage;
    setting a control voltage of the clock data recovery circuit to be equal to the reference voltage wherein the reference voltage is related to an oscillation frequency of the first voltage control oscillator;
    enabling the phase lock loop to generate a second level control signal;
    generating a data recovery clock according to the second level control signal by the second voltage control oscillator;
    enabling the clock data recovery circuit;
    generating a phase lock frequency signal according to the first level control signal by the first voltage control oscillator and generating the data recovery clock according to the first level control signal by the second voltage control oscillator; and
    comparing the frequencies of the phase lock frequency signal and the data recovery clock to generate a comparison result, wherein the second voltage control oscillator adjusts the frequencies of the data recovery clock to be substantially the same as the phase lock frequency signal according to the comparison result.

5. A control method for a voltage control oscillation device, comprising:
    providing a first voltage control oscillator disposed in a phase lock loop and a second voltage control oscillator disposed in a clock data recovery circuit; wherein the phase lock loop comprising a first voltage controlled oscillator gain (KVCO) and generating a first level control signal at a locked state according to a reference voltage;
    setting a control voltage of the clock data recovery circuit to be equal to the reference voltage wherein the reference voltage is related to an oscillation frequency of the first voltage control oscillator;
    enabling the phase lock loop generate a second level control signal;
    generating a data recovery clock according to the second level control signal by the second voltage control oscillator; and
    enabling the clock data recovery circuit
    setting the control voltage of the second voltage control oscillator to be equal to a first preset voltage and adjusting a resistance value of a variable resistor to let an output frequency of the second voltage control oscillator equal to a first frequency wherein the resistance value of the variable resistor is a first resistance value at the time; wherein the second voltage control oscillator comprises the variable resistor;

setting the control voltage of the second voltage control oscillator to be equal to a second preset voltage and adjusting a resistance value of the variable resistor to let an output frequency of the second voltage control oscillator equal to a second frequency wherein the resistance value of the variable resistor is a second resistance value at the time; and selecting one minimum resistance value from the first resistance value and the second resistance value to acquire a gain of the second voltage control oscillator to be equal to (the first frequency minus the second frequency) divided by (the first preset voltage minus the second preset voltage).

* * * * *